US012648413B2

(12) United States Patent　　(10) Patent No.: US 12,648,413 B2
Yu　　(45) Date of Patent: Jun. 2, 2026

(54) METHOD OF MANUFACTURING SEMICONDUCTOR DEVICE

(71) Applicant: Winbond Electronics Corp., Taichung City (TW)

(72) Inventor: Ping-Lung Yu, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 656 days.

(21) Appl. No.: 18/163,274

(22) Filed: Feb. 1, 2023

(65) Prior Publication Data

US 2023/0420255 A1　Dec. 28, 2023

(30) Foreign Application Priority Data

Jun. 28, 2022　(TW) ................................. 111123985

(51) Int. Cl.
*H10P 32/20*　(2026.01)
*H10B 41/30*　(2023.01)
*H10P 76/40*　(2026.01)
*H10P 30/40*　(2026.01)
*H10P 50/28*　(2026.01)

(52) U.S. Cl.
CPC ......... *H10P 76/4085* (2026.01); *H10B 41/30* (2023.02); *H10P 30/40* (2026.01); *H10P 32/20* (2026.01); *H10P 50/283* (2026.01)

(58) Field of Classification Search
CPC .............. H01L 21/0337; H01L 21/3115; H01L 21/31155
See application file for complete search history.

(56) References Cited

U.S. PATENT DOCUMENTS

| 9,905,754 B1 | 2/2018 | Yoon et al. | |
| 10,304,680 B1 | 5/2019 | Lee et al. | |
| 2016/0049307 A1* | 2/2016 | Chen | H01L 21/0337 |
| | | | 438/696 |
| 2019/0172714 A1* | 6/2019 | Bobek | H01L 21/0335 |

FOREIGN PATENT DOCUMENTS

| TW | I492298 | 7/2015 |
| TW | I607505 | 12/2017 |

* cited by examiner

*Primary Examiner* — Marlon T Fletcher
*Assistant Examiner* — Samuel Jonathan Smith
(74) *Attorney, Agent, or Firm* — JCIPRNET

(57) ABSTRACT

A method of manufacturing a semiconductor device includes the following. A core material layer and a patterned mask layer are formed above a target layer. A first spacer layer is formed and a first treatment process is performed to form a treated first spacer layer. A first removal process is performed on the treated first spacer layer and the patterned mask layer to form multiple first spacers. The core material layer is patterned to form a core layer using the first spacers as a mask. A second spacer layer is formed and a second treatment process is performed to form a treated second spacer layer. A second removal process is performed on the treated second spacer layer and the core layer to form multiple second spacers. A pattern of the second spacers is transferred to the target layer to form a patterned target layer.

19 Claims, 11 Drawing Sheets

METHOD OF MANUFACTURING SEMICONDUCTOR DEVICE

CROSS-REFERENCE TO RELATED APPLICATION

This application claims the priority benefit of Taiwan application Ser. No. 111123985, filed on Jun. 28, 2022. The entirety of the above-mentioned patent application is hereby incorporated by reference herein and made a part of this specification.

BACKGROUND

Technical Field

The disclosure relates to a method of manufacturing an integrated circuit, and in particular to a method of manufacturing a semiconductor device.

Description of Related Art

With the advancement of technology, all kinds of electronic products are developing towards the trend of thin and light, and the critical size of memory components is also gradually shrinking, which makes the photolithography process more and more difficult. In conventional photolithography processes, methods to reduce the critical size include the use of optical element with larger numerical apertures, shorter exposure wavelengths (e.g., EUV), or interface media other than air (e.g., water immersion). As the resolution of the conventional photolithography process approaches its theoretical limit, manufacturers have begun to turn to double-patterning (DP) methods to overcome the optical limit, and thereby increasing integration of the memory components.

However, in the current patterning methods, the pattern is often bent or collapsed because of the large height to width ratio. Therefore, there is an urgent need for a patterning method to avoid the aforementioned problem.

SUMMARY

A method of manufacturing a semiconductor device according to an embodiment of the disclosure includes the following. A core material layer is formed above a target layer. A patterned mask layer is formed on the core material layer. A first spacer layer is formed to cover the patterned mask layer and the core material layer. A first treatment process is performed to form a treated first spacer layer. A first removal process is performed on the treated first spacer layer and the patterned mask layer to form multiple first spacers. The core material layer is patterned to form a core layer using the first spacers as a mask. A second spacer layer is formed to cover the core layer. A second treatment process is performed to form a treated second spacer layer. A second removal process is performed on the treated second spacer layer and the core layer to form multiple second spacers. A pattern of the second spacers is transferred to the target layer to form a patterned target layer.

A method of manufacturing a semiconductor device according to an embodiment of the disclosure includes the following. A core material layer is formed above a target layer. A patterned mask layer is formed on the core material layer. A first spacer layer is formed to cover the patterned mask layer and the core material layer. A first removal process is performed on the first spacer layer and the patterned mask layer to form multiple first spacers. The core material layer is patterned to form a core layer using the first spacers as a mask. A second spacer layer is formed to cover the core layer. A second removal process is performed on the second spacer layer and the core layer to form multiple second spacers. A pattern of the second spacers is transferred to the target layer to form a patterned target layer. Before the first removal process is performed or the second removal process is performed, a treatment process is performed to change a property of the first spacer layer or the second spacer layer.

According to the embodiment of the disclosure, by means of the first treatment process and/or the second treatment process, the first spacer layer and/or the second spacer layer may be made to have better properties and strength, so that the subsequent formation of the first spacer and the second spacer may be prevented from bending or collapsing, and the target layer may be formed with a desired pattern.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1J are schematic cross-sectional views of a method of manufacturing a semiconductor device according to an embodiment of the disclosure.

DESCRIPTION OF THE EMBODIMENTS

Figures 1A, 1B:
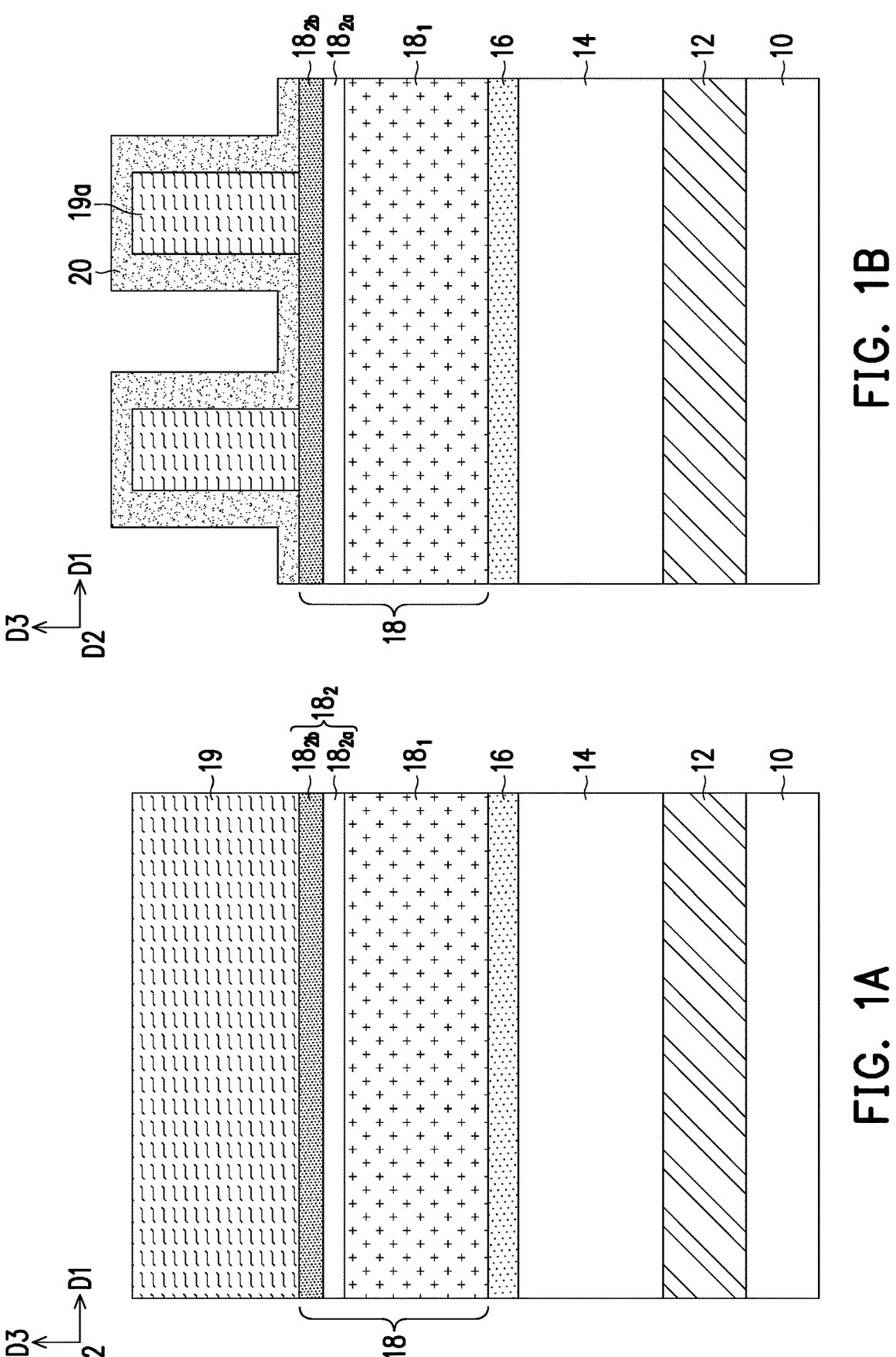

Referring to FIG. 1A, a substrate 10 is provided. The substrate 10 may be, for example, a semiconductor substrate, a semiconductor compound substrate, or a semiconductor over insulator (SOI) substrate. According to this embodiment, the substrate 10 is a silicon substrate.

Figure 3:
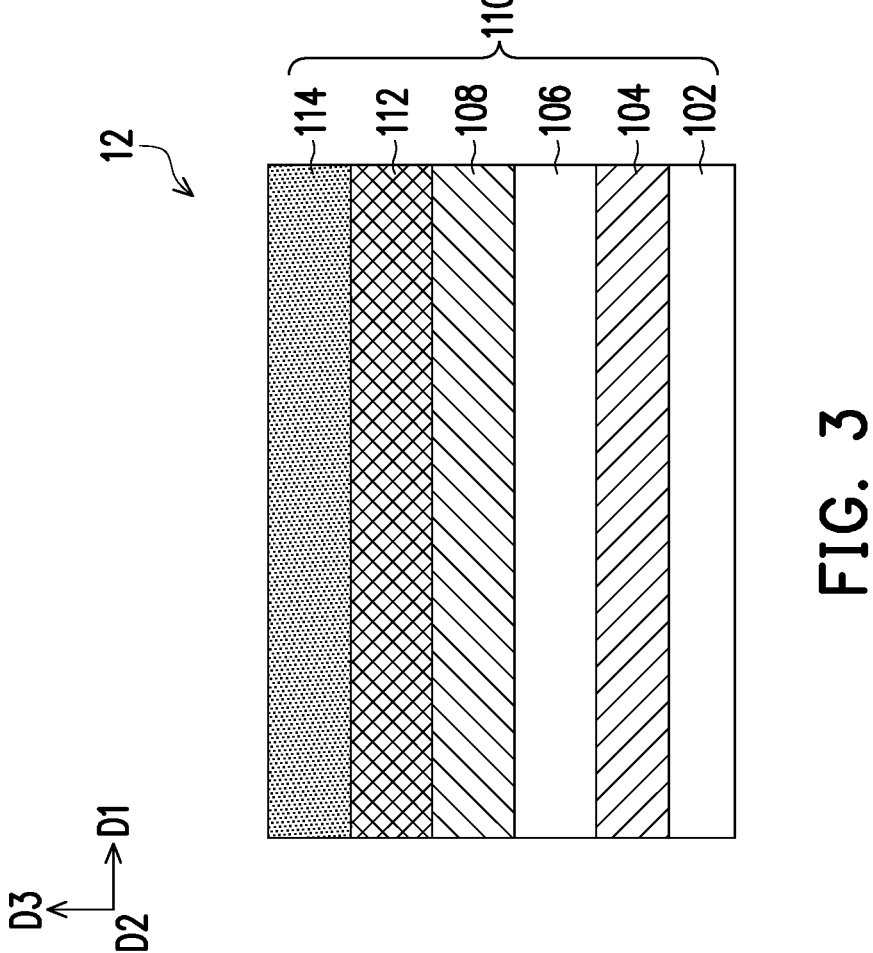
FIG. 3 is a schematic cross-sectional view of a stacked structure according to another embodiment of the disclosure.

Next, a target layer 12 is formed on the substrate 10. The target layer 12 may be a stacked structure 110 stacked in a direction D3, as shown in FIG. 3. Specifically, the stacked structure 110 may include multiple layers of materials for flash memory devices, such as a tunnel dielectric layer 102, a patterned floating gate layer 104, an inter-gate dielectric layer 106, a control gate layer 108, a metal layer 112, and a cap layer 114 from bottom to top. A material of the tunnel dielectric layer 102 may be, for example, silicon oxide. The patterned floating gate layer 104 may extend in a direction D2, and its material may include a conductor material, such as doped polysilicon, non-doped polysilicon, or a combination thereof. The inter-gate dielectric layer 106 may be, for example but not limited to, a composite layer composed of nitride/oxide/nitride/oxide/nitride (NONON), and the composite layer may have three, five, or more layers. A material of the control gate layer 108 may include a conductor material, such as doped polysilicon, non-doped polysilicon, or a combination thereof. A material of the metal layer 112 may be, for example, W, TiN, or a combination thereof. A material of the cap layer 114 may include a dielectric material, such as silicon nitride, silicon oxynitride, or a combination thereof.

Then, a sacrificial layer 14 and a hard mask layer 16 are formed on the target layer 12. The sacrificial layer 14 may also be referred to as a hard mask layer. The sacrificial layer 14 may be a dielectric material such as silicon oxide and silicon nitride. The material of the hard mask layer 16 may be different from the material of the sacrificial layer 14. The hard mask layer 16 may be a single layer or multiple layers. The hard mask layer 16 may be a dielectric material such as silicon nitride.

After that, a core material layer 18 is formed on the hard mask layer 16. According to one embodiment, the core material layer 18 may include a carbon-containing layer. According to another embodiment, the core material layer 18 may include a carbon-containing layer $18_1$ and an anti-reflection layer $18_2$. The carbon-containing layer $18_1$ may be, for example, spin-on carbon. The anti-reflection layer $18_2$ may be a single layer or multiple layers. The anti-reflection layer $18_2$ may be, for example, a silicon oxynitride layer. According to one embodiment, a material of the anti-reflection layer $18_2$ includes a silicon-rich silicon oxynitride layer $18_{2a}$ and an oxygen-rich silicon oxynitride layer $18_{2b}$.

Then, a mask layer 19 is formed on the core material layer 18. The mask layer 19 is, for example, a photoresist layer. After that, a self-aligned quadruple patterning (SAQP) process is performed.

First, referring to FIG. 1B, a first self-aligned double patterning (SADP) process is performed. For example, the mask layer 19 is patterned by a photolithography process to form multiple patterned mask layers 19a. The patterned mask layer 19a is, for example, multiple long stripes extending in the direction D2 and arranged in the direction D1.

Next, a spacer layer 20 is formed on the substrate 10 to cover the patterned mask layer 19a and the core material layer 18. The material of the spacer layer 20 is different from the material of the mask layer 19. The mask layer 19 is a photosensitive material, and the spacer layer 20 is a non-photosensitive material. The spacer layer 20 may be a dielectric material. The dielectric material may be an oxide, such as silicon oxide, formed by, for example, atomic layer deposition.

Figures 1C, 1D:
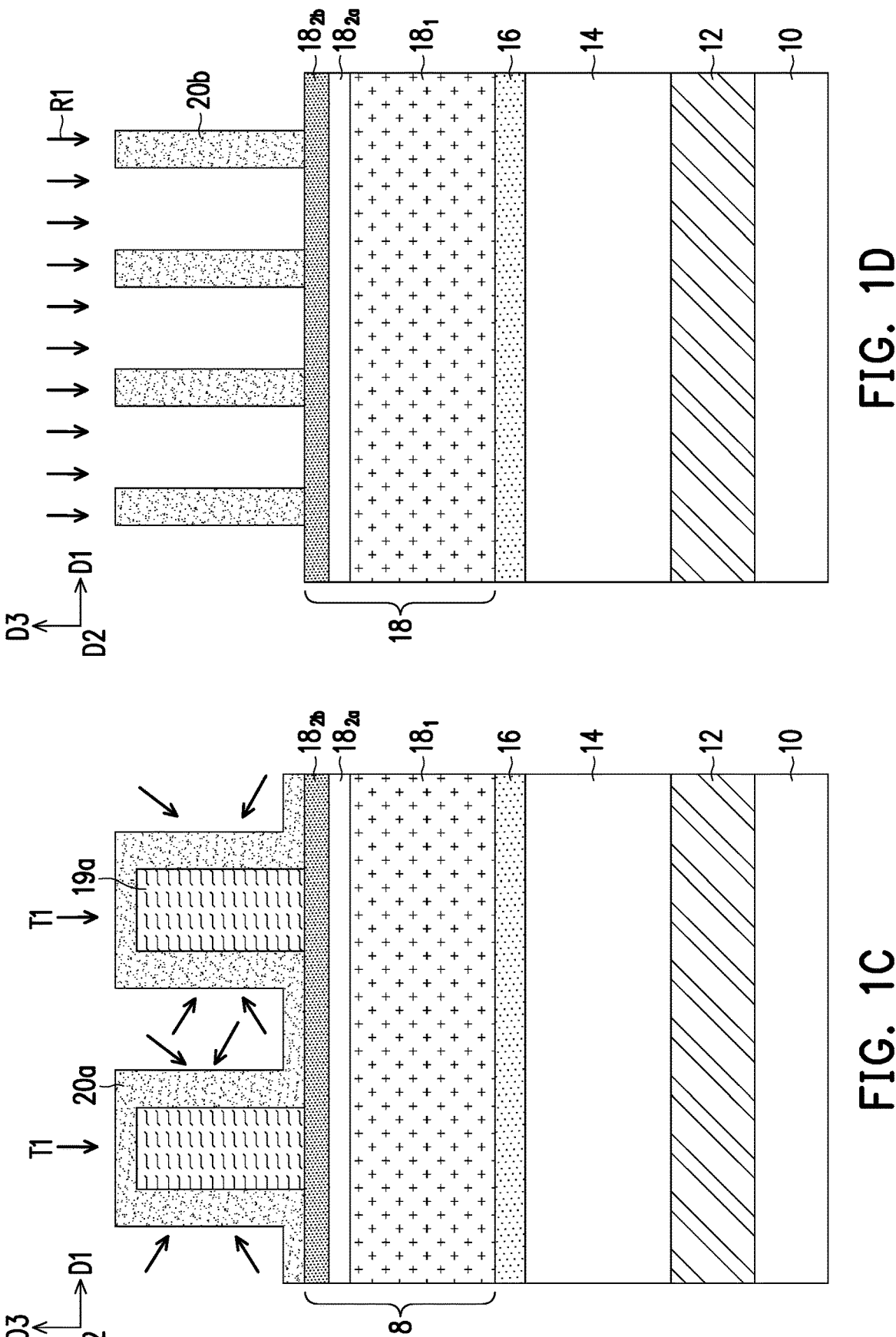

Next, referring to FIG. 1C, a first treatment process T1 is performed to form a treated spacer layer 20a. The first treatment process T1 includes a plasma treatment process or an ion implantation process. Substances used in the first treatment process T1 include $O_2$, $N_2$, $N_2O$, Ar, He, $NH_3$, $H_2$, Ne, Kr, As, $BF_2$, B, C, N, P, Ge, In, F or a combination thereof. According to one embodiment, the first treatment process T1 is a plasma treatment process using gas including $O_2$, $N_2$, $N_2O$, Ar, He, $NH_3$, $H_2$, Ne, Kr or a combination thereof, with energy ranging from 10 watts to 1000 watts. According to one embodiment, the first treatment process T1 is an ion implantation process using dopants including As, $BF_2$, B, C, N, P, Ge, In, F or a combination thereof, with dopant dosage ranging from E11 to E16/ $cm^2$ and energy ranging from 1 keV to 2000 keV.

According to one embodiment, density of the treated spacer layer 20a is higher than density of the untreated spacer layer 20. According to another embodiment, hardness of the treated spacer layer 20a is higher than hardness of the untreated spacer layer 20. According to still other embodiments, hydrophilicity of the treated spacer layer 20a is different from hydrophilicity of the untreated spacer layer 20.

After that, referring to FIG. 1D, a first removal process R1 is performed to remove a part of the treated spacer layer 20a and the patterned mask layer 19a to form multiple spacers 20b. The first removal process R1 includes an anisotropic etching process, such as a dry etching process.

Figure 1F:
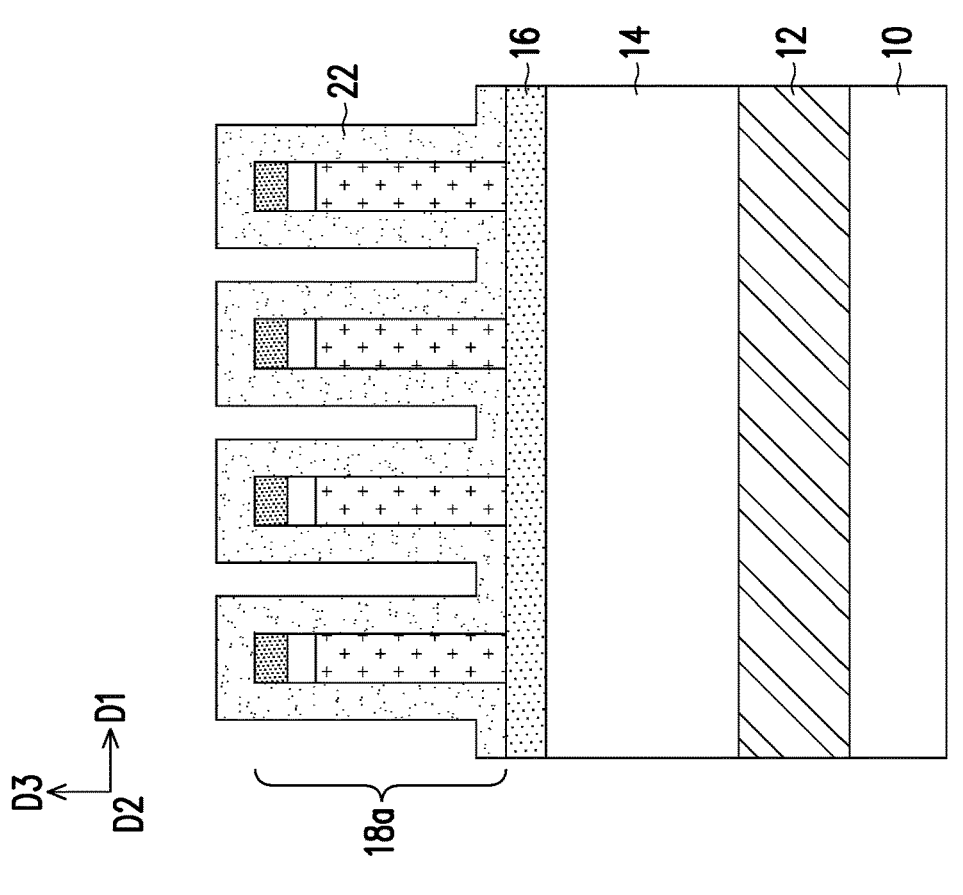
Figure 1E:
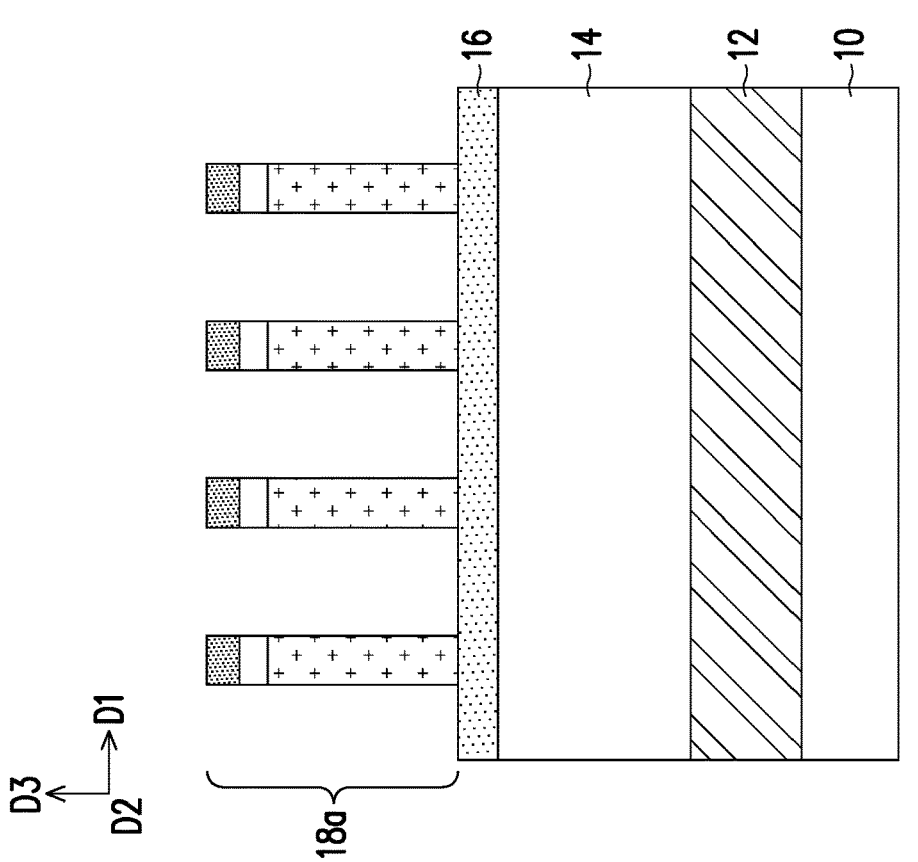

Then, referring to FIG. 1E, the core material layer 18 is patterned by an etching process using the spacer 20b as a mask to form a core layer 18a.

Next, referring to FIG. 1F, a second self-aligned double patterning process is performed. A spacer layer 22 is formed above the substrate 10 to cover the core layer 18a. The spacer layer 22 is a non-photosensitive material. The spacer layer 22 may be a dielectric material. The dielectric material may be an oxide, such as silicon oxide, formed by, for example, atomic layer deposition.

Figures 1G, 1H:
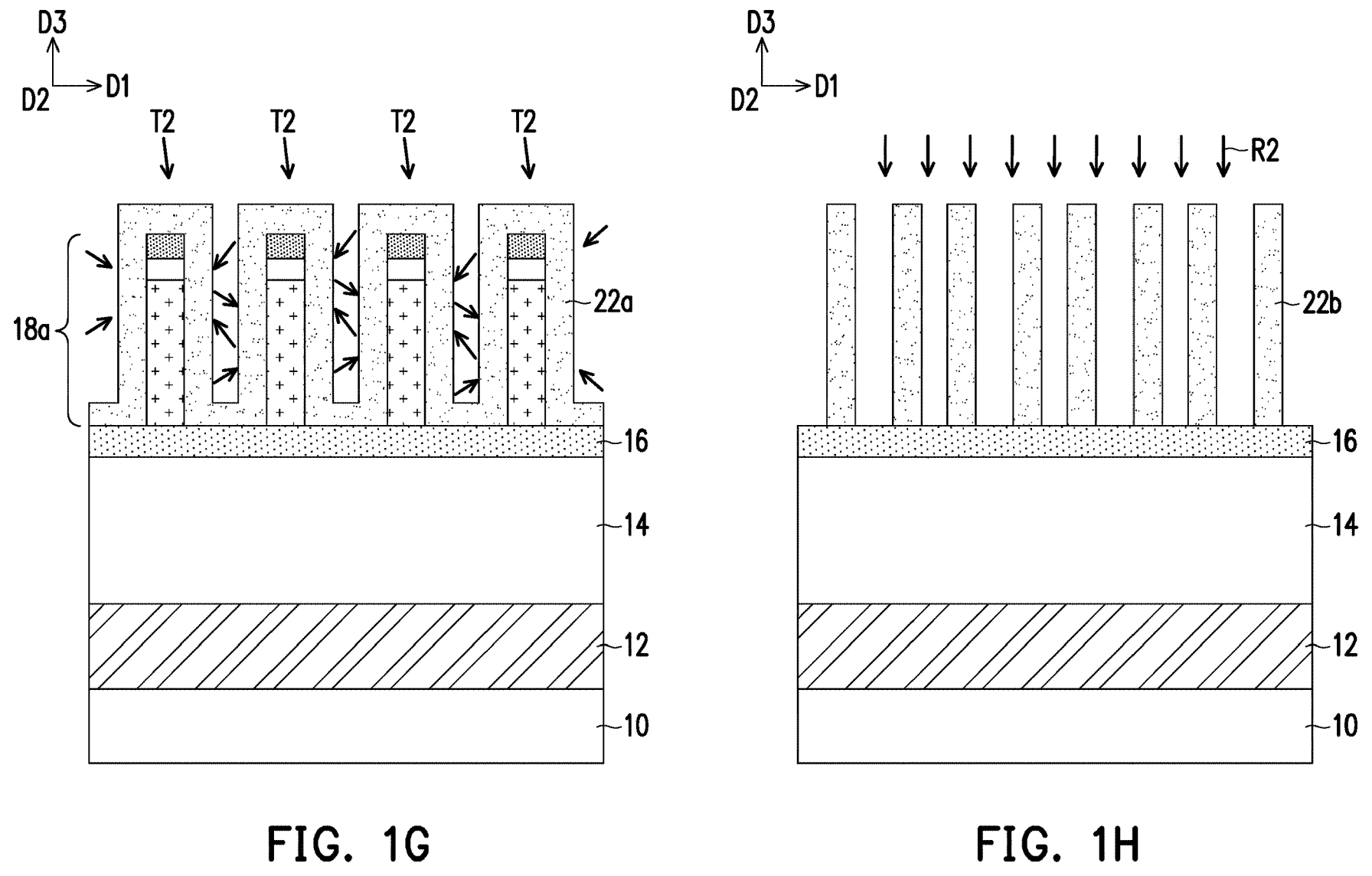

After that, referring to FIG. 1G, a second treatment process T2 is performed to form a treated spacer layer 22a. The second treatment process T2 may use similar processes and settings as the first treatment process T1, and therefore will not be repeated in the following.

According to one embodiment, density of the treated spacer layer 22a is higher than density of the untreated spacer layer 22. According to another embodiment, hardness of the treated spacer layer 22a is higher than hardness of the untreated spacer layer 22. According to still another embodiment, hydrophilicity of the treated spacer layer 22a is different from hydrophilicity of the untreated spacer layer 22.

According to one embodiment, energy and dosage of the second treatment process T2 may be greater than or equal to the energy, dosage, or flow rate of the first treatment process T1, so that the treated spacer layer 22a has better strength and properties to avoid bending or collapse in the subsequent process.

Then, referring to FIG. 1H, a second removal process R2 is performed to remove a part of the treated spacer layer 22a and the core layer 18a to form multiple spacers 22b. The second removal process R2 includes an anisotropic etching process, such as a dry etching process.

Figure 1J:
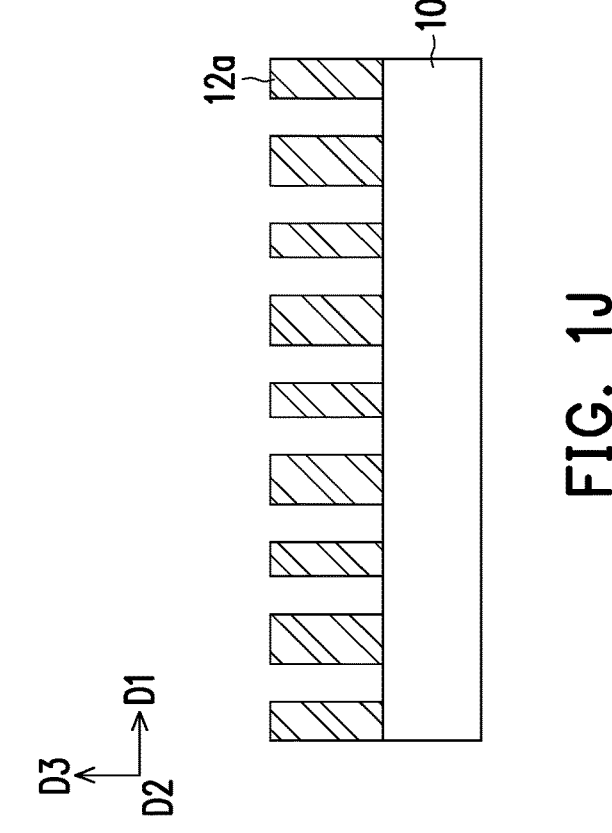
Figure 1I:
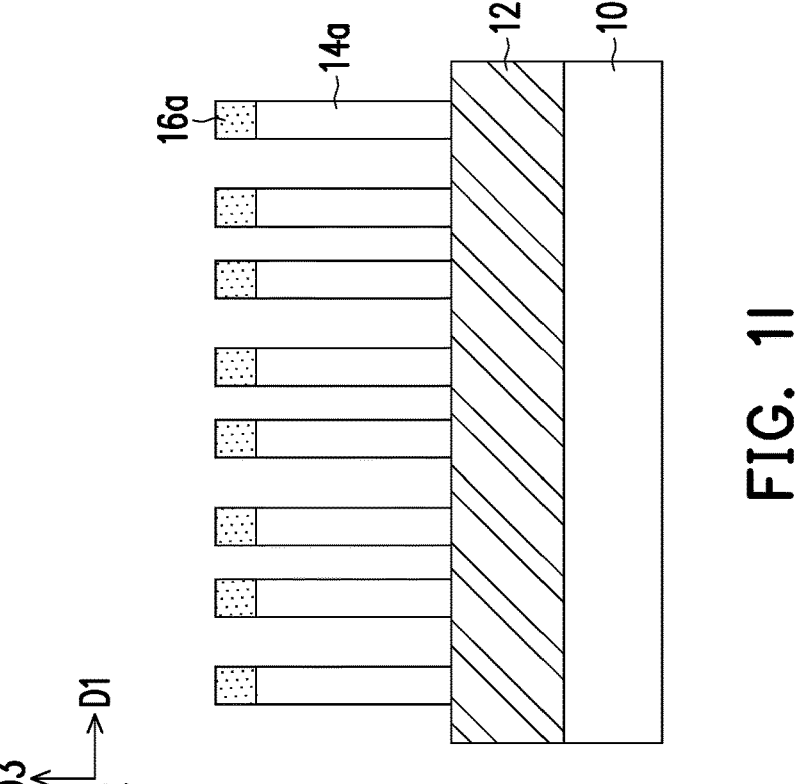

Next, referring to FIG. 1I, the hard mask layer 16 and the sacrificial layer 14 are patterned by an etching process (e.g., an anisotropic etching process) using the spacer 22b as a mask to form a patterned hard mask layer 16a and a patterned sacrificial layer 14a.

Then, referring to FIG. 1J, the target layer 12 is patterned using the patterned hard mask layer 16a as a mask to form a patterned target layer 12a. The patterned target layer 12a is, for example, multiple long stripes extending in the direction D2 and arranged in the direction D1, but not limited thereto.

According to the embodiments, in the process of forming the core layer 18a, the spacer is etched out; however, the disclosure is not limited thereto.

FIG. 2A to FIG. 2E are similar to the method with reference to FIG. 1A to FIG. 1E until the core layer 18a is formed. However, in the process of forming the core layer 18a, the spacer 20b has a residual portion 20c remaining on the core layer 18a.

Figures 2A, 2B:
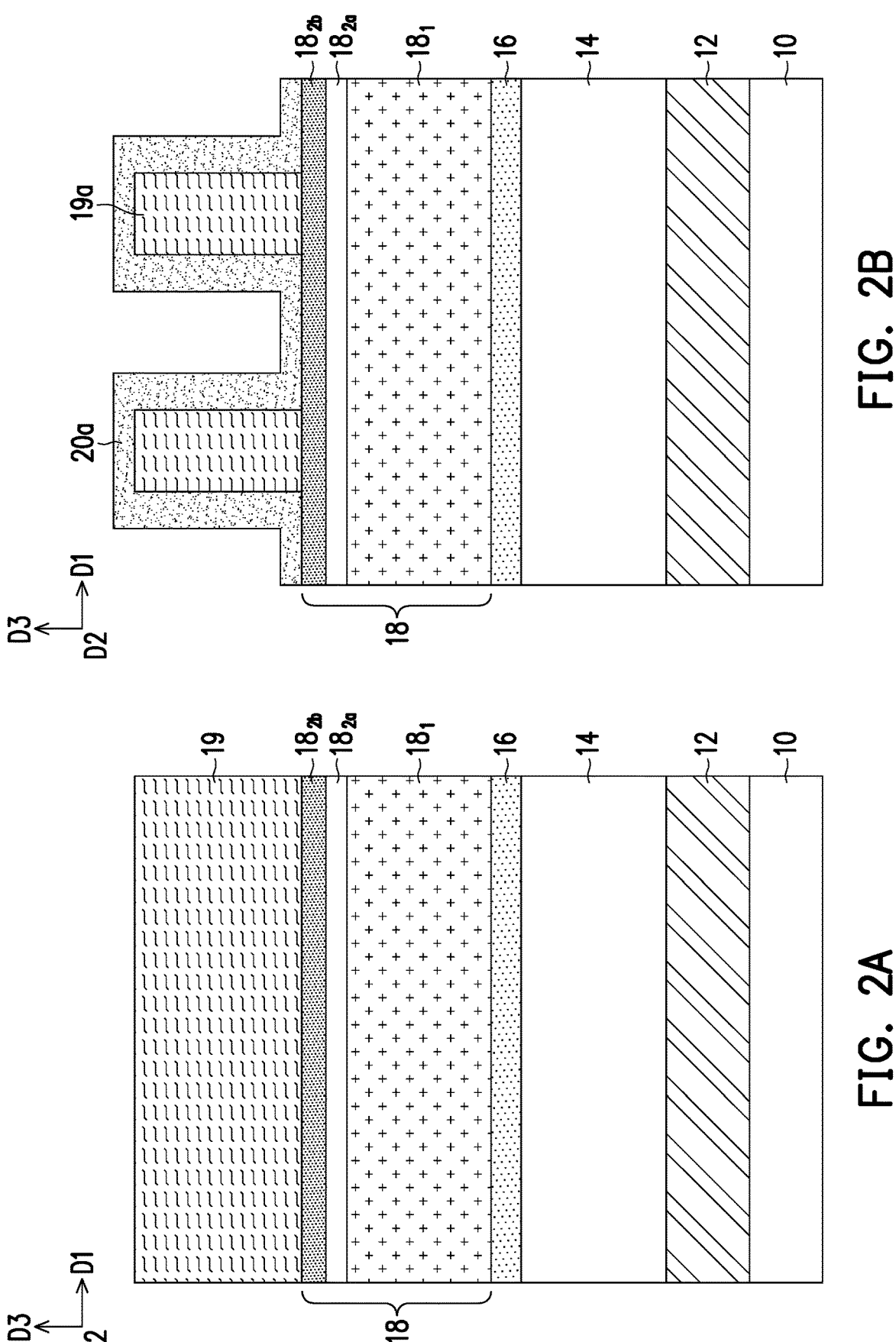
FIG. 2A to FIG. 2J are schematic cross-sectional views of a method of manufacturing a semiconductor device according to another embodiment of the disclosure.
Figures 2C, 2D:
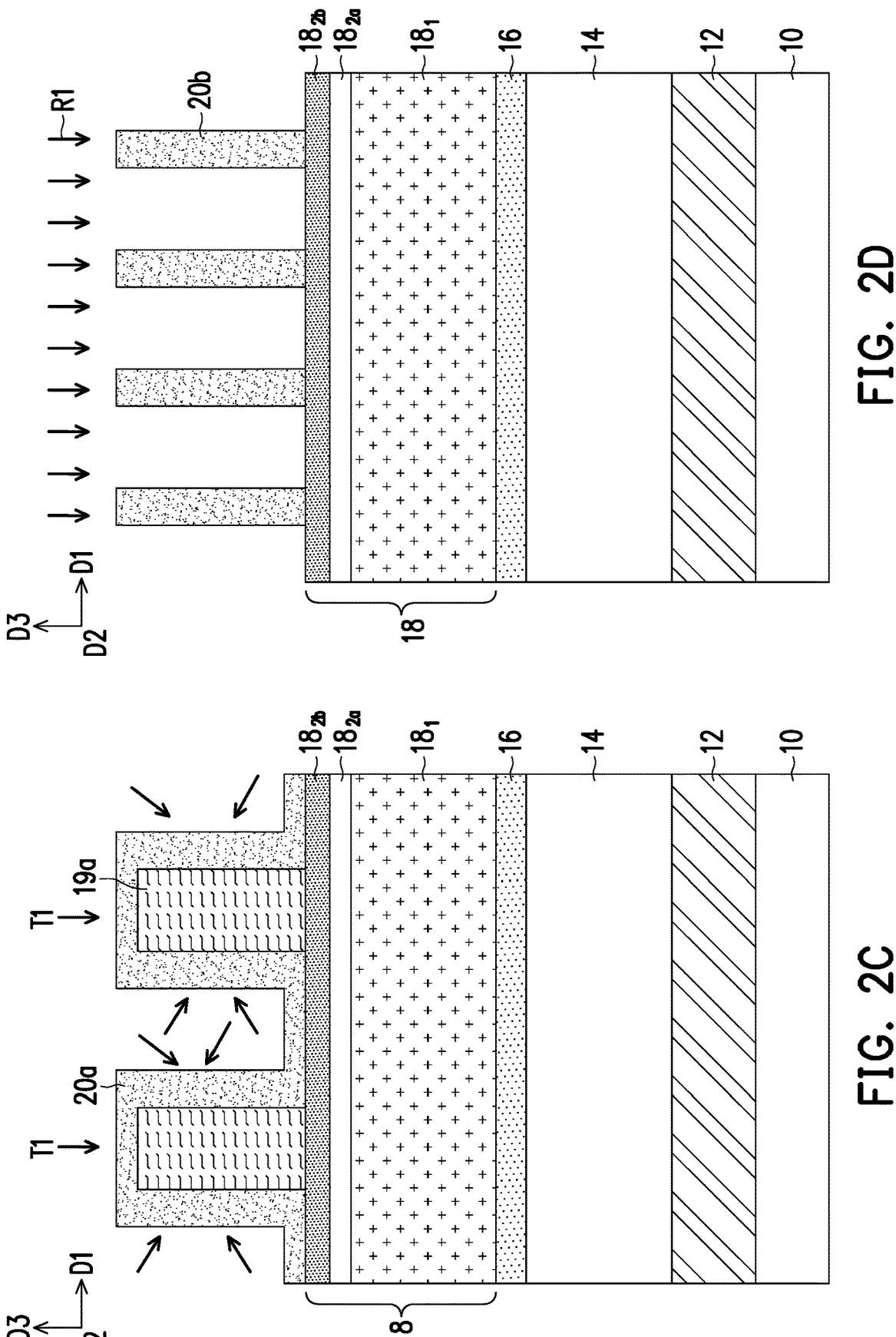
Figures 2E, 2F:
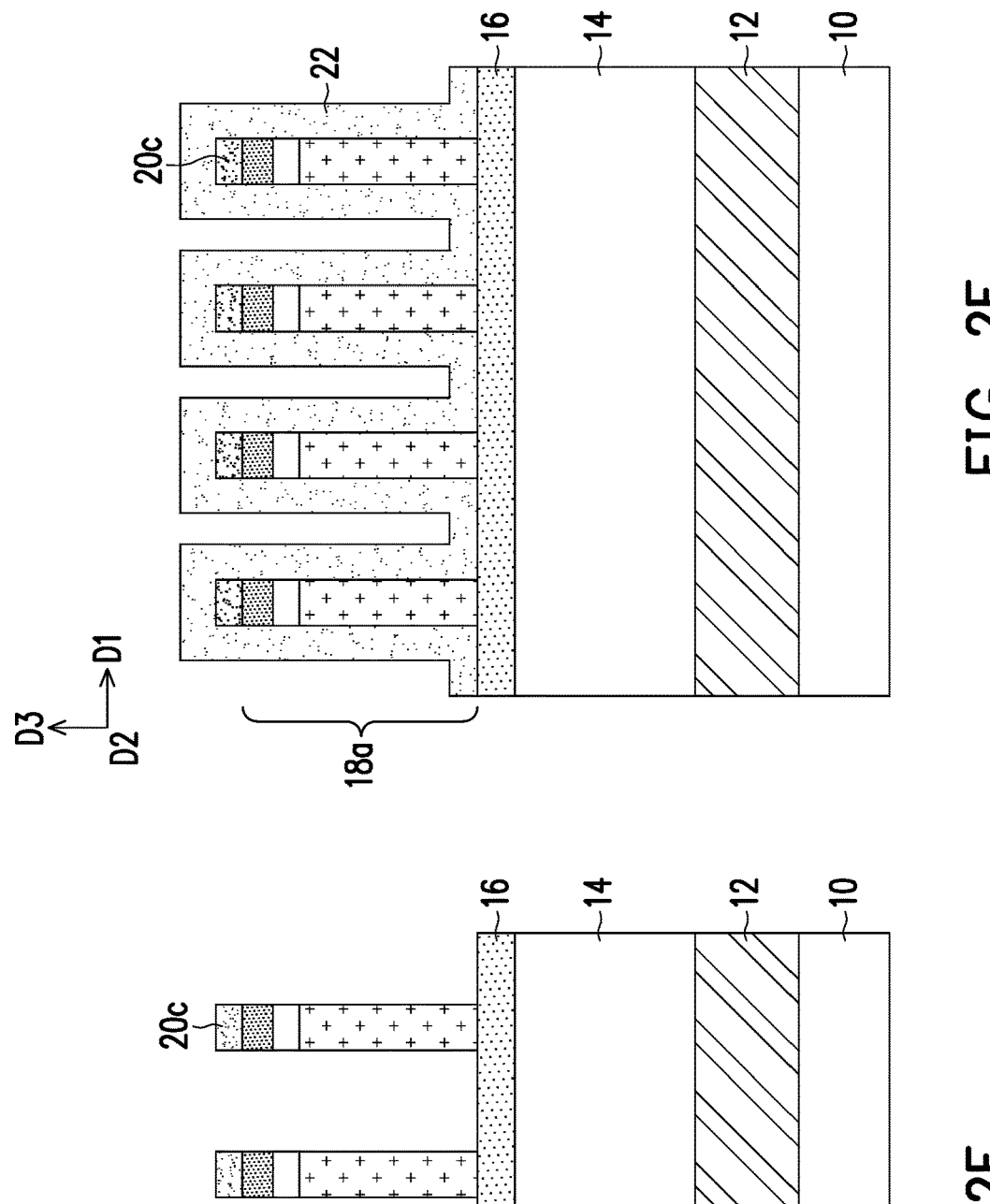
Figure 2H:
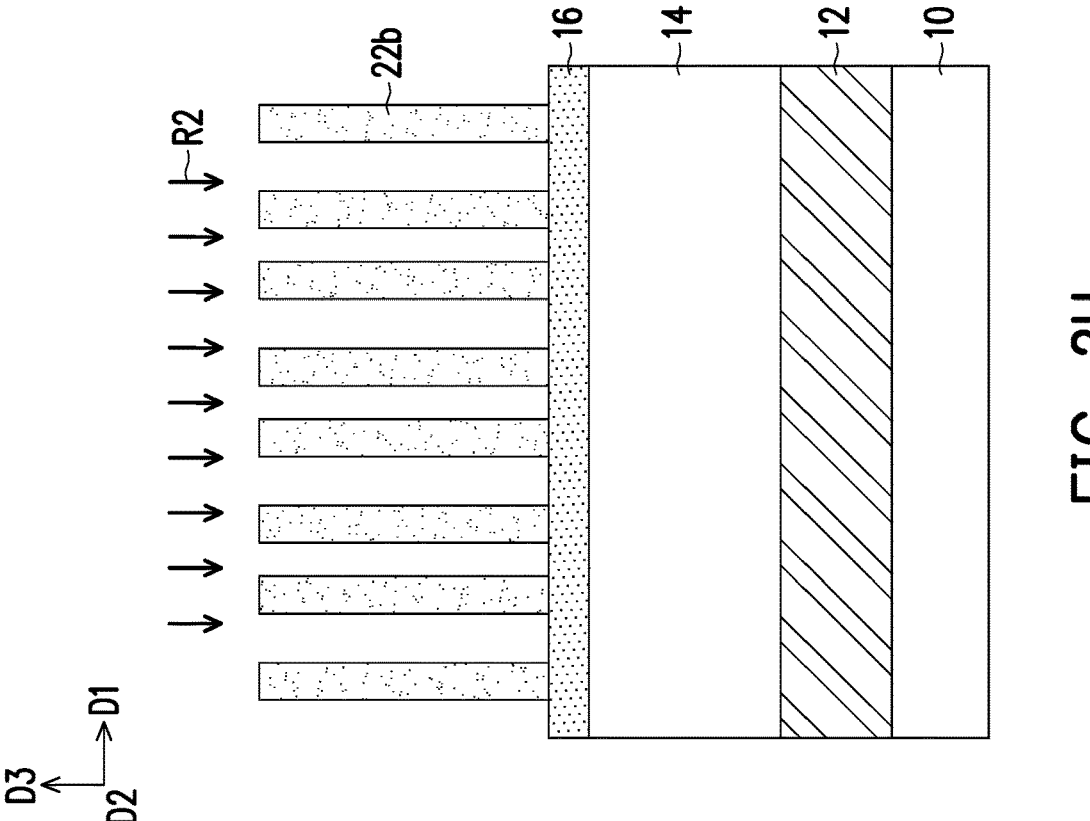
Figure 2G:
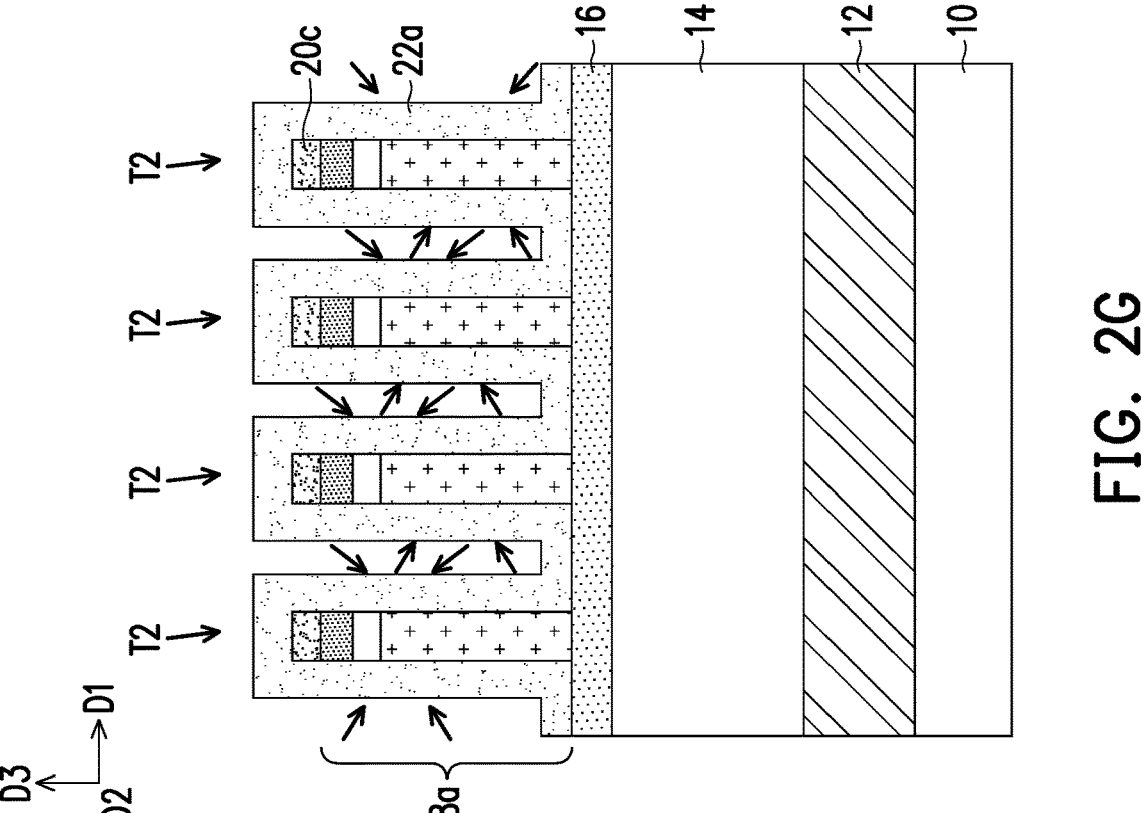

FIG. 2F and FIG. 2G show the residual portion 20c and the spacer layer 22 to be formed later, which still cover the core layer 18a during the second treatment process T2, and are covered by the treated spacer layer 22a.

Referring to FIG. 2H, during the second removal process R2 to form multiple spacers 22b, the residual portion 20c are removed together with the core layer 18a.

Figure 2J:
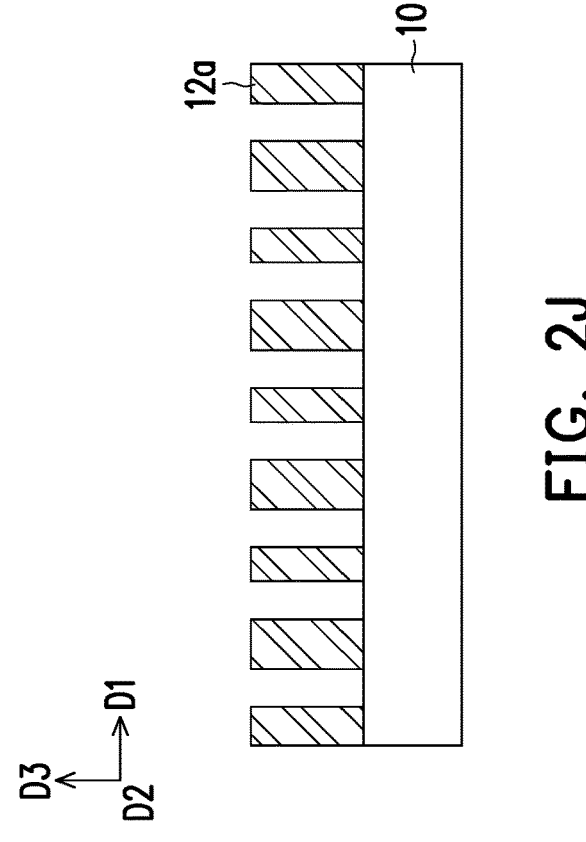
Figure 2I:
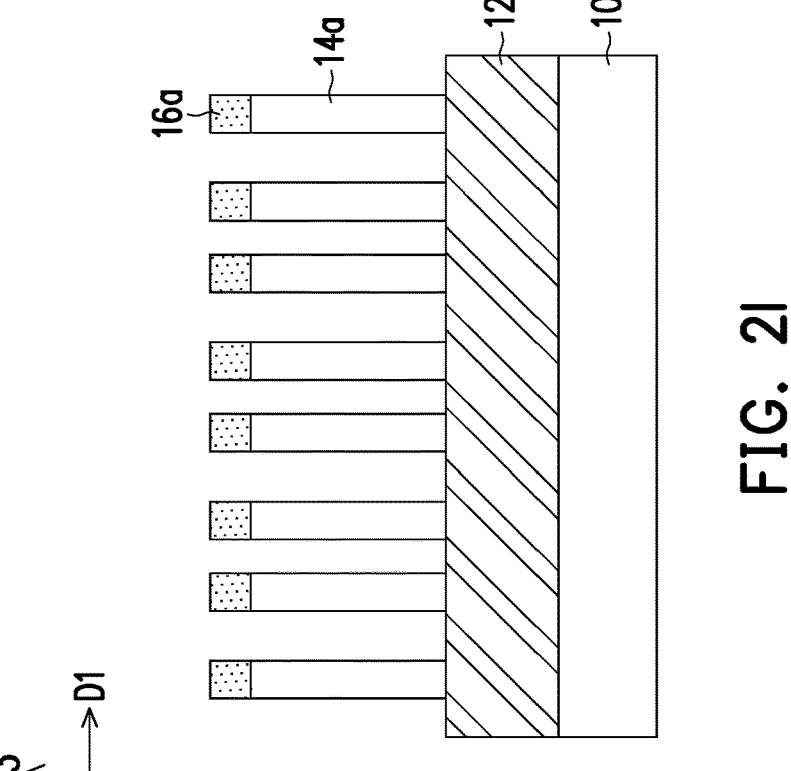

FIG. 2I and FIG. 2J follow the method corresponding to FIG. 1I and FIG. 1J until the patterned target layer 12*a* is formed.

According to the embodiment, before the first removal process R1 and the second removal process R2, the first treatment process T1 is performed on the spacer layer 20, and the second treatment process T2 is performed on the spacer layer 22. However, the disclosure is not limited thereto. According to another embodiment, one of the first treatment process T1 and the second treatment process T2 may be performed.

Although the embodiments are examples of flash memory to illustrate a series of steps for patterning, the disclosure is not limited thereto. According to other embodiments, the patterning step may also be used to form a dynamic random access memory or similar target layer/film.

According to the embodiment of the disclosure, by means of the first treatment process and/or the second treatment process, the first spacer layer and/or the second spacer layer may be made to have better properties and strength, so that the subsequent formation of the first spacer and the second spacer may be prevented from bending or collapsing, and the target layer may be formed with a desired pattern.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A method of manufacturing a semiconductor device, comprising:

forming a core material layer above a target layer;

forming a patterned mask layer on the core material layer;

forming a first spacer layer to cover the patterned mask layer and the core material layer;

performing a first treatment process to form a treated first spacer layer;

performing a first removal process on the treated first spacer layer and the patterned mask layer to form a plurality of first spacers;

patterning the core material layer to form a core layer using the first spacers as a mask;

forming a second spacer layer to cover the core layer;

performing a second treatment process to form a treated second spacer layer, wherein during the second treatment process, a part of the second spacer layer remains covering the core layer;

performing a second removal process on the treated second spacer layer and the core layer to form a plurality of second spacers; and transferring a pattern of the second spacers to the target layer to form a patterned target layer.

2. The method of manufacturing the semiconductor device according to claim 1, wherein a material of the first spacer layer and the second spacer layer comprises a dielectric material.

3. The method of manufacturing the semiconductor device according to claim 1, wherein density of the treated first spacer layer is higher than density of the first spacer layer.

4. The method of manufacturing the semiconductor device according to claim 1, wherein density of the treated second spacer layer is higher than density of the second spacer layer.

5. The method of manufacturing the semiconductor device according to claim 1, wherein hardness of the treated first spacer layer is higher than hardness of the first spacer layer.

6. The method of manufacturing the semiconductor device according to claim 1, wherein hardness of the treated second spacer layer is higher than hardness of the second spacer layer.

7. The method of manufacturing the semiconductor device according to claim 1, wherein hydrophilicity of the treated first spacer layer is different from hydrophilicity of the first spacer layer.

8. The method of manufacturing the semiconductor device according to claim 1, wherein hydrophilicity of the treated second spacer layer is different from hydrophilicity of the second spacer layer.

9. The method of manufacturing the semiconductor device according to claim 1, wherein dosage of the second treatment process is greater than dosage of the first treatment process.

10. The method of manufacturing the semiconductor device according to claim 1 further comprising:

forming a sacrificial layer on the target layer; and forming a hard mask layer on the target layer, wherein transferring the pattern of the second spacers to the target layer to form the patterned target layer comprises:

patterning the hard mask layer and the sacrificial layer to form a patterned hard mask layer and a patterned sacrificial layer using the second spacers as a mask; and patterning the target layer to form the patterned target layer using the patterned hard mask layer as a mask.

11. The method of manufacturing the semiconductor device according to claim 1, wherein the first treatment process comprises a plasma treatment process or an ion implantation process.

12. The method of manufacturing the semiconductor device according to claim 1, wherein the second treatment process comprises a plasma treatment process or an ion implantation process.

13. A method of manufacturing a semiconductor device, comprising:

forming a core material layer above a target layer;

forming a patterned mask layer on the core material layer;

forming a first spacer layer to cover the patterned mask layer and the core material layer;

performing a first removal process on the first spacer layer and the patterned mask layer to form a plurality of first spacers;

patterning the core material layer to form a core layer using the first spacers as a mask;

forming a second spacer layer to cover the core layer;

performing a first treatment process to change a property of the second spacer layer and to form a treated second spacer layer, wherein during the first treatment process, a part of the second spacer layer remains covering the core layer;

performing a second removal process on the treated second spacer layer and the core layer to form a plurality of second spacers; and transferring a pattern of the second spacers to the target layer to form a patterned target layer.

14. The method of manufacturing the semiconductor device according to claim 13, further comprising performing a second treatment process to change a property of the first spacer layer and to form a treated first spacer layer, wherein density of the treated first spacer layer is higher than density of the first spacer layer.

15. The method of manufacturing the semiconductor device according to claim 13, wherein density of the treated second spacer layer is higher than density of the second spacer layer.

16. The method of manufacturing the semiconductor device according to claim 14, wherein hardness of the treated first spacer layer is higher than hardness of the first spacer layer.

17. The method of manufacturing the semiconductor device according to claim 13, wherein hardness of the treated second spacer layer is higher than hardness of the second spacer layer.

18. The method of manufacturing the semiconductor device according to claim 14, wherein hydrophilicity of the treated first spacer layer is different from hydrophilicity of the first spacer layer.

19. The method of manufacturing the semiconductor device according to claim 13, wherein hydrophilicity of the treated second spacer layer is different from hydrophilicity of the second spacer layer.

* * * * *